United States Patent [19]

Temple

[11] 4,314,266
[45] Feb. 2, 1982

[54] THYRISTOR WITH VOLTAGE BREAKOVER CURRENT CONTROL SEPARATED FROM MAIN EMITTER BY CURRENT LIMIT REGION

[75] Inventor: Victor A. K. Temple, Clifton Park, N.Y.

[73] Assignee: Electric Power Research Institute, Inc., Palo Alto, Calif.

[21] Appl. No.: 196,098

[22] Filed: Oct. 10, 1980

Related U.S. Application Data

[63] Continuation of Ser. No. 926,564, Jul. 20, 1978, abandoned.

[51] Int. Cl.³ .............................................. H01L 29/74
[52] U.S. Cl. ...................................... 357/38; 357/13; 357/20; 357/51; 357/55; 357/86
[58] Field of Search .................. 357/13, 38, 20, 51, 357/86, 55

[56] References Cited

U.S. PATENT DOCUMENTS

| | | | |
|---|---|---|---|
| 3,408,545 | 10/1968 | De Cecco et al. | 357/38 |
| 3,524,114 | 8/1970 | Hutson | 357/38 |
| 3,566,211 | 2/1971 | Suedberg | 357/86 |
| 3,590,346 | 6/1971 | Biloetac | 357/38 |
| 3,766,450 | 10/1973 | Voss et al. | 357/38 |
| 3,967,308 | 6/1976 | Yatsuo et al. | 357/38 |
| 4,012,761 | 3/1977 | Ferro et al. | 357/38 |
| 4,238,761 | 12/1980 | Schlegel et al. | 357/38 |

Primary Examiner—Joseph E. Clawson, Jr.
Attorney, Agent, or Firm—Flehr, Hohbach, Test, Albritton & Herbert

[57] ABSTRACT

A thyristor of the type having a localized voltage breakover region is provided with current limiting means for controlling the current through the device during initial voltage breakover. The thyristor base zone is divided into two at least partially separated base portions, one of which is in the vicinity of the localized breakover region. The other base portion is in the main current-carrying part of the thyristor in contact with the main emitter. The two base portions are electrically connected by current limiting means. When breakover occurs by way of a forward anode-cathode voltage which exceeds the thyristor forward breakover voltage, the rise in current is limited by the current limiting means.

25 Claims, 15 Drawing Figures

THYRISTOR WITH VOLTAGE BREAKOVER CURRENT CONTROL SEPARATED FROM MAIN EMITTER BY CURRENT LIMIT REGION

This is a continuation, of application Ser. No. 926,564 filed July 20, 1978, now abandoned.

BACKGROUND OF THE INVENTION

The invention relates generally to thyristors, and more particularly to thyristors of the type having a localized region within the semiconductor body at which voltage breakover initiates when the forward anode-cathode voltage exceeds the forward breakover voltage.

Switching a thyristor into conduction by exceeding the forward breakover voltage can result in damage to the device. One cause of damage is the small size of the voltage breakover region which is initially turned on. If the current rises rapidly to large values before a sufficient portion of the main current carrying part of the device turns on, significant power dissipation occurs. As a result of local overheating in the initial breakover region, the device fails.

Techniques have been developed for localizing the initial breakover region within a thyristor. One method is to produce a localized region of lower resistivity in the N-substrate. A region of lower resistivity can be produced by passing a beam of neutrons through the semiconductor material. By the well known process of neutron transmutation, the silicon is partially converted to phosphorus, which raises the level of N-type doping within the irradiated area. The result is a localized reduction in resistivity, which creates a localized initial breakover region at the adjacent pn junction. The position of the breakover region can be advantageously located within the thyristor body. For example, it is known that positioning the voltage breakover region beneath a centrally located gate electrode is known to produce more rapid thyristor turn-on.

Localizing and positioning the voltage breakover region in a thyristor does not solve the problem of large power dissipation during initial breakover, however. The large currents which occur at breakover must still initially pass through a small junction area. Unless external circuit conditions control the initial current, overheating and destruction of the breakover junction will lead to premature failure of the device.

OBJECTS AND SUMMARY OF THE INVENTION

It is a general object of the present invention to provide a thyristor device which includes means for controlling the current through the device when the forward breakover voltage is exceeded.

Another object of the present invention is to provide a method of forming a thyristor device which includes a current-controlling impedance for controlling power dissipation during voltage breakover.

Accordingly, a thyristor device is provided for controlling current flow between a pair of terminals and which switches into forward conduction from the blocking mode when the terminal voltage between the terminals exceeds the breakover voltage. The thyristor device includes a semiconductor body having at least four zones of alternate conductivity type extending between the terminals. One zone is an emitter zone in contact with one of the terminals. An adjacent zone is a base zone. A blocking pn junction defines the boundary between the base zone and a third zone adjacent the base zone. The body includes means for localizing a breakover portion of the blocking pn junction where forward breakover initiates when the terminal voltage exceeds the breakover voltage. The base zone includes a first base portion disposed adjacent the breakover portion of the blocking pn junction and a second base portion separated at least partially from the first base portion. The emitter zone contacts the second base portion. The device further includes current limiting means interconnecting the first and second base portions.

The method of forming a thyristor from the semiconductor body described above includes the step of etching into the semiconductor body to divide and at least partially separate the base zone into the two base portions. The method also includes providing current limiting means to interconnect the first and second base portions to control the current across the breakover portion of the blocking pn junction when the breakover voltage is exceeded.

DESCRIPTION OF THE PREFERRED EMBODIMENT

Figures 1, 2:
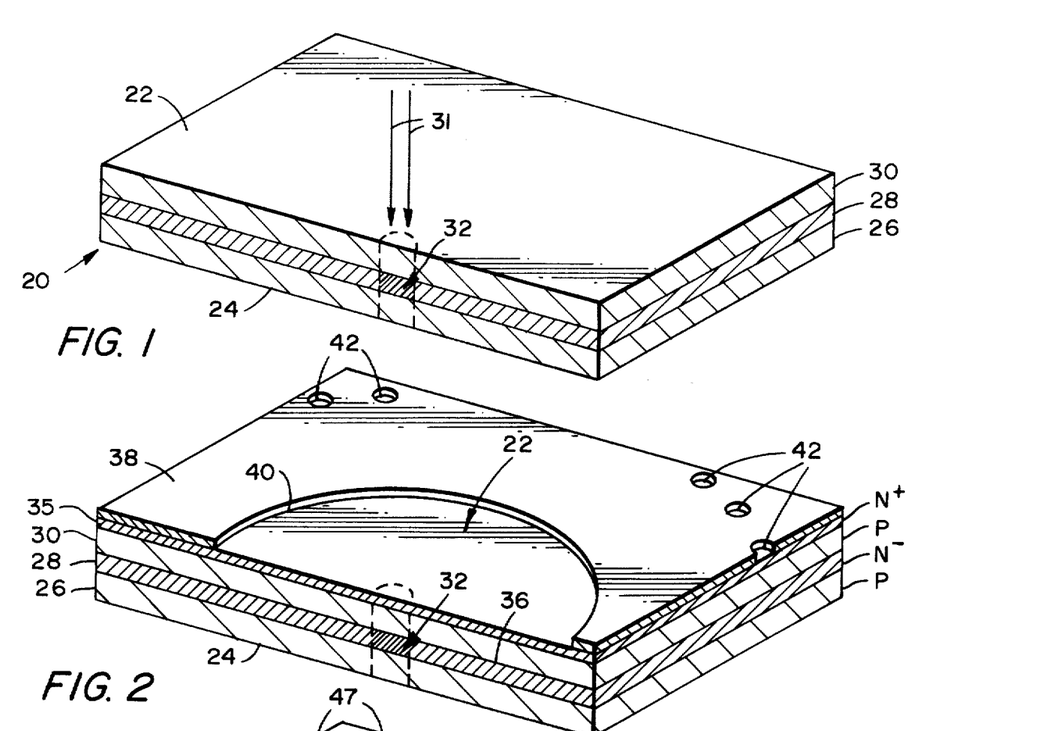
FIGS. 1–5 are perspective views in partial cross-section showing the method of forming a thyristor according to the present invention.

A thyristor device according to the present invention is formed beginning with a foundation semiconductor body 20 having opposed top and bottom surfaces 22 and 24 respectively. Body 20 is typically formed of monocrystalline silicon processed to provide a PNP structure having intermediate pn junctions substantially parallel with surfaces 22 and 24. A suitable method of forming body 20 begins with an N-type silicon chip into which impurities are subsequently diffused through the top and bottom surfaces. One or more of the conductivity zones may alternatively be formed by epitaxial growth, ion implantation or another suitable method. The resultant three layers comprise a bottom layer 26 of P conductivity type, an intermediate layer 28 of N conductivity type, and an upper layer 30 of P conductivity type. Body 20 preferably includes a localized region of lower resistivity in N-type intermediate layer 28, to provide a region of lower breakover voltage centrally disposed in the body. Formation of such a localized region in body 20 can be achieved by suitable manufacturing techniques well known in the art. For example, a beam of neutrons can be passed through body 20 in the direction of arrows 31. The neutron beam causes a localized region 32 in the body to be partially converted to phosphorus by the process of neutron transmutation. The phosphorus enhances the level of N-type dopant in zone 28 to produce a small area having lower resistivity. Region 32 produces a localized voltage breakover region centrally disposed in body 20.

The method of forming a first embodiment of a thyristor according to the invention from body 20 is illustrated in FIGS. 2-5. An additional zone 35 is first added to body 20 to provide the typical thyristor structure having at least four zones of alternate conductivity type, 26, 28, 30 and 35, as shown in FIG. 2. Top zone 35 is formed by any suitable method such as diffusion, epitaxial growth or ion implantation. The resultant thyristor body has an NPNP structure with layer 35 forming the emitter zone and adjacent layer 30 forming the base zone. The third zone of the body is intermediate zone 28. A pn junction 36 defines the boundary between base 30 and third zone 28. In FIG. 2 zones 35 and 28 are respectively designated N+ and N− to reflect the relatively higher level of N-type impurity doping in zone 35.

Following formation of the four-zone structure, the top surface of body 20 is covered with a masking layer 38. A suitable photoresist mask can be used. Mask 38 initially covers the entire top surface 22. Portions are then removed by conventional photolithographic techniques to produce a masking pattern as shown in FIG. 2. The pattern includes a large central opening 40. Additional smaller openings 42 are formed outside opening 40 to provide emitter shorts.

Following formation of the masking pattern of FIG. 2, conventional etching techniques are employed to etch into the upper surface 22 of body 20. An etching solution is used which attacks the silicon of the body but not the masking layer 38. Etching is allowed to proceed to a depth sufficient to penetrate emitter zone 35 and expose a portion of base zone 30 within openings 40 and 42.

Figures 3, 4:
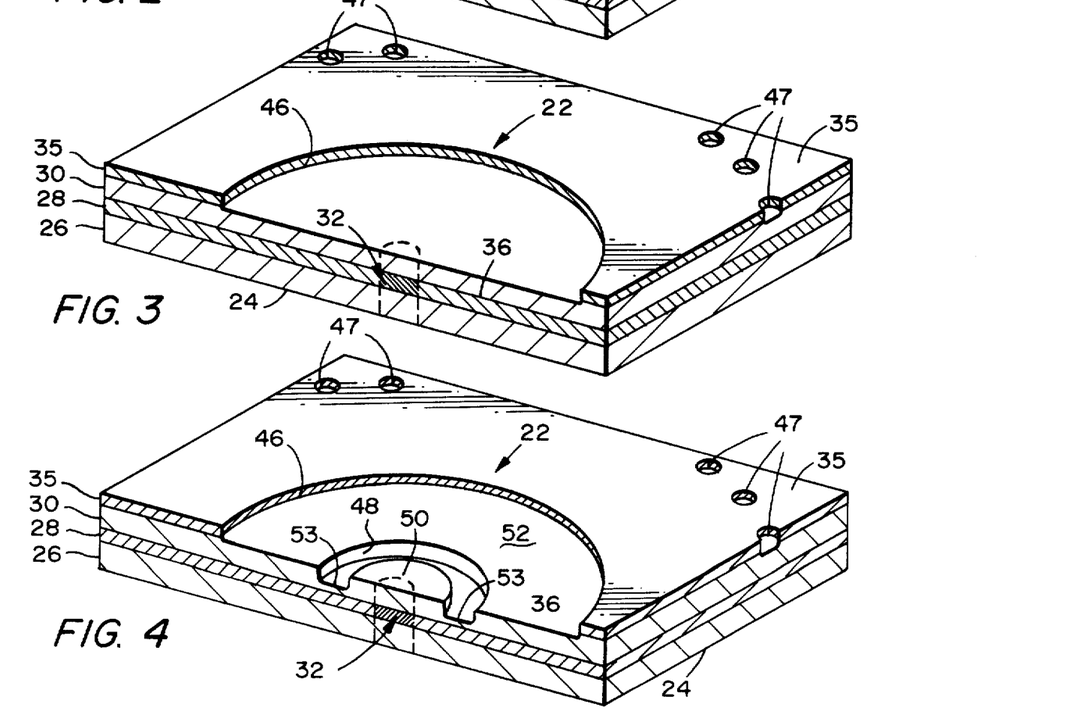

The configuration resulting after mask 38 is removed is shown in FIG. 3. Emitter zone 35 has been removed from within mask opening 40. The portion of emitter 35 which remains forms the first or main emitter of the thyristor. Base zone 30 extends to top surface 22 within mask opening 40. The inner edge of the emitter-base pn junction forms the turn-on line 46 of the thyristor. Openings 47 in the emitter correspond to openings 42 in mask 38.

Another etching step is then performed on the body. This etching step produces a deep etch 48 in base zone 30 extending from top surface 22, as shown in FIG. 4. Etch 48 is substantially ring-shaped and encircles a central portion of the base zone overlying voltage breakover region 32. To produce etch 48, a suitable etch-impervious mask layer such as silicon dioxide is first grown or otherwise formed on top surface 22. A ring-shaped opening corresponding to the width of etch 48 is then formed in the mask layer by conventional photolithographic and etching techniques. The exposed ring-shaped portion of surface 22 is then subjected to an etching solution of the type which etches into the semiconductor body but does not attack the mask of silicon dioxide. In the first embodiment, etching is allowed to proceed to a predetermined depth in base zone 30. The resultant etch 48 forms a closed ring cutting deep into base zone 30, dividing the base into a first base portion 50 centrally disposed over region 32 of the body, encircled by a second base portion 52 extending outwardly from the etch. The two base portions are only partially separated, being interconnected by a broad and relatively thin unremoved connecting portion 53 of the base zone.

Figure 7:
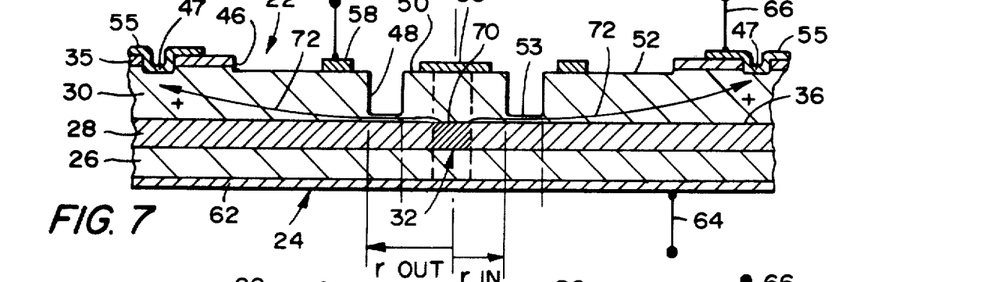
FIG. 7 is a cross-sectional view of the thyristor of FIG. 6 taken along the line 7—7.

Connecting portion 53 provides the current control mechanism of the first embodiment of the invention. Portion 53 has a much higher resistivity than the adjacent unetched base portion. The specific resistance R in the base zone between the inner first base portion 50 and second base portion 52 is given by $$R = \frac{\rho_\square}{2\pi} \ln \frac{r_{out}}{r_{in}}$$

where $\rho_\square$ is the sheet resistance of the thinned connecting portion 53, and $r_{out}$ and $r_{in}$ are the outer and inner radii of the deep etch (see FIG. 7). The value of R is controlled both by the depth of the etch and the values of $r_{out}$ and $r_{in}$. A wide leeway is available in the value of R, allowing the thyristor to be tailored to specific circuit requirements. A typical value for the resistance R of connecting portion 53 would be, for example, 500 ohms.

Figure 5:
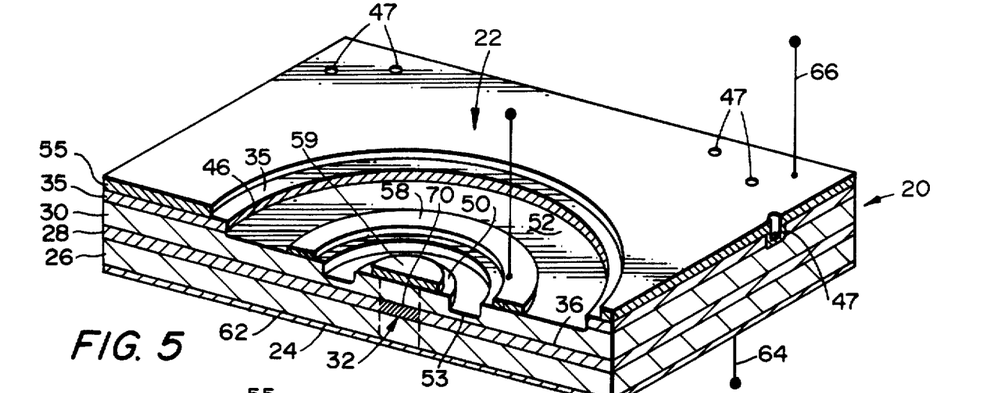
Figure 6:
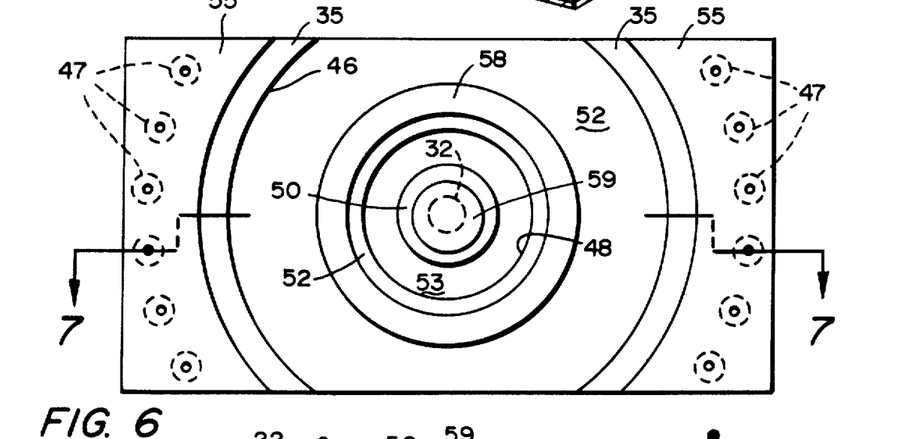
FIG. 6 is a partial top view of the thyristor of FIG. 5.

Following removal of the masking layer employed in forming etch 48, top surface 22 is coated by conventional means with a layer of suitable conductive metal, such as aluminum. Portions of the metal layer are then removed by conventional photolithographic and etching techniques to provide a metalization pattern as shown in FIG. 5. The metal in contact with first emitter 35 outside turn-on line 46 forms an emitter electrode 55 Electrode 55 extends into openings 47 to contact base 30 and provide a line of emitter shorts. Another metal electrode 58 remains within turn-on line 46, encircling first base portion 50. Electrode 58 extends around etch 48 in contact with second base portion 52, forming the gate electrode of the thyristor. It is also desirable to leave a metalized area 59 on the top surface of first base portion 50. Electrode 59, which is referred to herein as the first base electrode, serves to more evenly distribute the current through first base portion 50 during voltage breakover. The completed thyristor also includes a metalized electrode 62 on bottom surface 24 in contact with bottom layer 26, forming the thyristor anode electrode. Anode 62 is applied either simultaneously with the top surface metalization, or at another time. A pair of terminals provide for external connections to the anode and cathode metalizations. Terminal 64 is connected to anode 62 and terminal 66 contacts first emitter 35 by way of emitter electrode 55. The four zones of the device extend between terminals 64 and 66.

The resultant thyristor serves as a switching device for controlling current flow between terminals 64 and 66. When in a forward blocking mode with anode terminal 64 forward biased relative to cathode terminal 66, only a small leakage current passes through the device due to carrier depletion in the vicinity of junction 36. Junction 36 thus serves as a forward blocking pn junction. Application of a small positive voltage to gate electrode 58 causes electrons to flow in large numbers across the emitter-base junction starting at turn-on line 46. The resultant infusion of electrons into base 30 turns on the thyristor, allowing a large forward current to flow. Turn-on is substantially uniform along turn-on line 46 because the encircling emitter 35 is spaced on equal minimum distance from the gate at all points. Such gate-triggered turn-on allows a relatively small gate current to control a much larger current between terminals 64 and 66. The forward blocking state is restored by momentarily reversing the bias on terminals 64 and 66, as is well known in the art.

The thyristor can also be switched into forward conduction from a blocking mode by raising the terminal voltage between terminals 64 and 66 above the forward breakover voltage. To simplify the forward breakover turn-on process, as the forward bias of the anode increases, the leakage current through the device begins to rise. When the terminal voltage across the device reaches the forward breakover voltage, the leakage current produces avalanche breakdown at the blocking pn junction. Avalanche breakdown generates large numbers of carriers in the base zone. Electrons are drawn toward the anode and holes pass through the base toward emitter shorts 47. The hole current in the base turns on the thyristor at the emitter-base junction. Turn-on via voltage breakover requires no external gate current. The blocking mode is restored after momentary reversal of the terminal voltage.

The region of lower resistivity 32 in the N-substrate 28 provides means for localizing a breakover portion 70 of junction 36 at which forward voltage breakover will initiate. Breakover occurs first at portion 70 because the higher doping in region 32 of adjacent zone 28 reduces the width of the depletion layer, lowering the breakover voltage. The higher breakover voltage along the remainder of junction 36 prevents initial breakover outside breakover portion 70.

In the first embodiment thyristor, when turn-on is by forward voltage breakover, current between terminals 64 and 66 will initially pass through connective base portion 53. This is because most of junction 36 remains blocking and only portion 70 is conducting. Arrows 72 in FIG. 7 illustrate paths of initial forward voltage breakover current flow through the thyristor. Connecting portion 53 of base 30 has a significantly higher sheet resistance than the remainder of the base zone because of etch 48. The initial current between terminals 64 and 66 is therefore limited by the higher resistivity of etched portion 53. Portion 53 introduces a series resistance between the anode and cathode during breakover which prevents localized burnout along junction 36. As the current flows through breakover region 70 and into first base portion 50, metalized area 59 helps to more evenly distribute the charge. The current passing through the base zone will rapidly switch the main current carrying part of the thyristor into forward conduction after voltage breakover. A substantially free flow of current between terminals 64 and 66 will therefore be established. Once the thyristor is turned on, breakover portion 70 is bypassed by the low resistance path through the remainder of the device.

The present invention provides for current control in the voltage breakover region of a thyristor. Power dissipation in the voltage breakover region is greatly reduced. The built-in impedance provided by etch 48 significantly limits the forward voltage breakover current through the thyristor device. Precise control of the size of the impedance and hence the current limiting ability is achieved by controlling the width and depth of etch 48. Performance of the gate-triggered portion of the thyristor outside etch 48 is not impaired by the partial isolation of a small portion of the base zone.

The size and depth of deep etch 48 can be varied to accommodate design requirements. For example, where relatively high breakover currents are anticipated, there will be a potential problem with ohmic heating of base connecting portion 53. To compensate for possible excessive temperatures, the volume of portion 53 should be enlarged by making etch 48 broader, but less deep. Alternatively, portion 53 could be enlarged by increasing the total length of the etch, enlarging the diameter of central base portion 50. The shape and size of etch 48 as shown in the figures is suggestive only, and alternative deep etch configurations can be employed.

Figure 8:
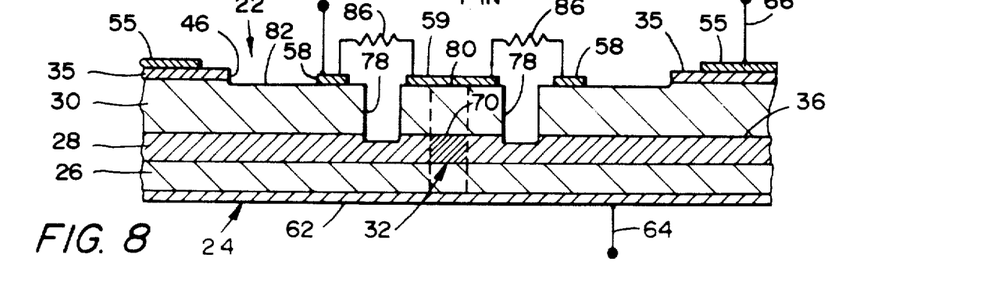
FIG. 8 is a cross-sectional view as in FIG. 7 showing another embodiment of a thyristor according to the invention.

An alternative embodiment of the invention, employing an external current limiting circuit impedance element, is shown in FIG. 8. The method of forming this embodiment begins with the same fabrication steps shown in FIGS. 1-3 for the first embodiment. A semiconductor body 20 having at least four zones of alternate conductivity type is provided. The semiconductor body has a centrally-disposed region of lower resistivity 32 in the N-substrate. Consequently, the adjacent pn junction 36 includes the localized breakover portion 70 of the first embodiment. The top surface emitter pattern is the same as in the first embodiment. The second etching step producing etch 48 is prolonged slightly in this embodiment to etch the semiconductor body to a greater depth. The resultant etch 78 extends through base zone 30 to third zone 28, dividing and fully separating the base zone into first and second base portions 80 and 82, respectively.

The electrodes in the alternative embodiment include a first base electrode 59 in contact with the central first base portion 80. First base electrode 59 is essentially the same as in the first embodiment. A gate electrode 58 and emitter electrode 55 are also provided, as in the first embodiment. Formation of the electrodes of this embodiment is accomplished by first metalizing the entire top surface 22 of the semiconductor body and then removing selected portions of the metalization by conventional photolithographic and etching techniques to leave electrodes 55, 58 and 59.

Fabrication of this alternative embodiment includes the additional step of connecting an impedance element between gate 58 and electrode 59. In the embodiment of FIG. 8, such impedance preferably includes one or more resistors 86. Resistors 86 serve to interconnect the separated base portions 80 and 82, in the same manner as connecting portion 53 of the first embodiment.

The embodiment of FIG. 8 functions in essentially the same way as the first embodiment thyristor. If the terminal voltage between terminals 64 and 66 exceeds the forward breakover voltage, forward breakover initiates at breakover portion 70. The initial current path between the cathode and anode passes through resistors 86. The resistors reduce the initial breakover current to a level which prevents excessive power dissipation at junction 36. The remainder of the device is subsequently turned on by the breakover current passing through the base zone.

As in the first embodiment, once the thyristor is fully turned on, the additional impedance of resistors 86 is effectively removed from the circuit. The large area of junction 36 outside base portion 80 provides an essentially open path for current flow between the terminals. The performance of the thyristor under normal gate-triggered turn-on is unimpaired by resistors 86. The external circuit element realization of the invention can provide larger resistance values than the partial etch of the first embodiment. The difficulty of precise depth control of the etch is also eliminated.

Figure 9:
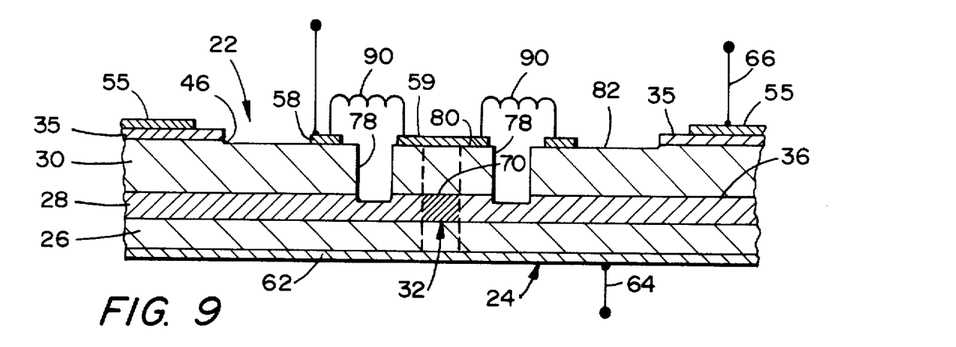
FIG. 9 is a cross-sectional view as in FIG. 7 showing another embodiment of a thyristor according to the invention.

Another embodiment having an external impedance element is shown in FIG. 9. This embodiment has exactly the same semiconductor body and method of formation as for the embodiment of FIG. 8. Etch 78 extends through base zone 30 to third zone 28, dividing the base and fully separating first and second base portions 80 and 82, respectively. A first base electrode 59 is provided on portion 80. In the embodiment of FIG. 9, an inductive element 90 is connected between gate 58 and electrode 59. Inductive element 90 interconnects the two base portions to provide an alternative type of current limiting means in the breakover region.

Operation of the embodiment of FIG. 9 is exactly the same as for the embodiment of FIG. 8. When the terminal voltage between terminals 64 and 66 exceeds the forward breakover voltage of the thyristor, forward breakover initiates at breakover portion 70 of junction 36. The forward voltage breakover current between the terminals passes through inductive elements 90. The inductive elements serve as current limiting means during initial turn-on when the current gradient is high. Excessive power dissipation in the breakover region 70 is thereby averted. As in the previous embodiments, current through the base zone subsequently turns on the remainder of the device, effectively removing inductive elements 90 from the circuit. Normal gate-triggered turn-on is not impaired.

The embodiment of FIG. 9 provides current limiting impedance of a type not readily realizable without the use of an external circuit element. Other external impedance elements could also be used, either singly or in combination. The thyristor can thus be tailored to specific circuit conditions.

Figure 10:
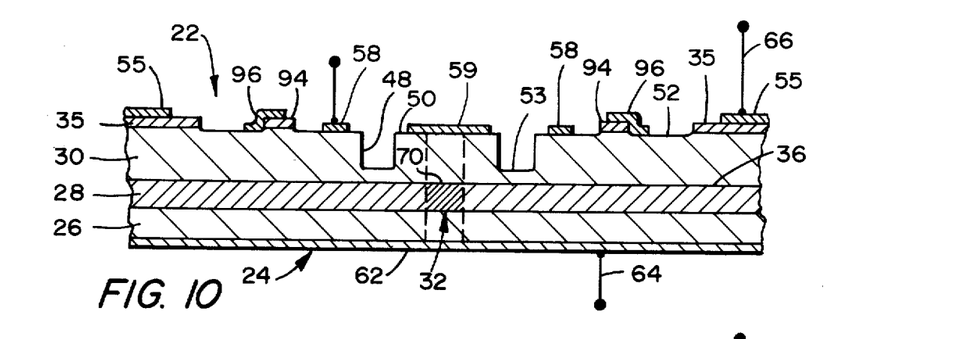
FIG. 10 is a cross-sectional view as in FIG. 7 showing another embodiment of a thyristor according to the invention.

Another embodiment of a thyristor according to the invention is shown in FIG. 10. In this embodiment, the built-in impedance feature of the present invention is applied to an amplifying-gate thyristor. In the method of forming the thyristor of FIG. 10, an additional ring-shaped portion of first mask 38, within circle 40, is left unremoved. In the subsequent etching step, the emitter zone is divided into a first emitter 35 and a separate amplifying stage emitter 94 on top surface 22. As in the first embodiment, the deep etching step produces an etch 48 which divides base zone 30 and partially separates first and second base portions 50 and 52, respectively. Both emitters 35 and 94 are left in contact with second base portion 52. In the metalization step, a cathode electrode 55, gate electrode, 58, and first base electrode 59 are provided as before. An amplifying gate electrode 96 is also provided on top surface 22, in contact with both amplifying stage emitter 94 and second portion 52 of base 30. Anode and cathode electrodes 62 and 55 are provided as in the first embodiment.

To turn on the thyristor of FIG. 10 by gate triggering, a positive gate current is supplied to electrode 58. With the anode forward biased relative to the cathode, electrons flow out of amplifying stage emitter 94 and across the base, turning on the amplifying stage. As a result, amplifying stage electrode 96 becomes positive, turning on the main thyristor at the junction between first emitter 92 and the base.

If the terminal voltage between the anode and cathode exceeds the breakover voltage of the thyristor, avalanche breakdown initiates at breakover portion 70 of junction 36. Because breakover portion 70 is adjacent first base portion 50 and partially separated from the remainder of the base, a resistive current path is provided through connecting base portion 53. The high resistivity of connecting base portion 53 serves as means for limiting the initial breakover current. As in the previous embodiments, the rest of the thyristor is subsequently turned on by current flow in the base, effectively removing impedance 53 from the circuit.

The embodiment of FIG. 10 illustrates that the present invention can be readily employed in amplifying-gate thyristor configurations. The built-in impedance does not impair the functioning of the gate-triggered portion of the thyristor. It is readily apparent that the external circuit element realizations of the invention shown in FIGS. 8 and 9 could also be provided with amplifying stages as shown in FIG. 10.

Figure 11:
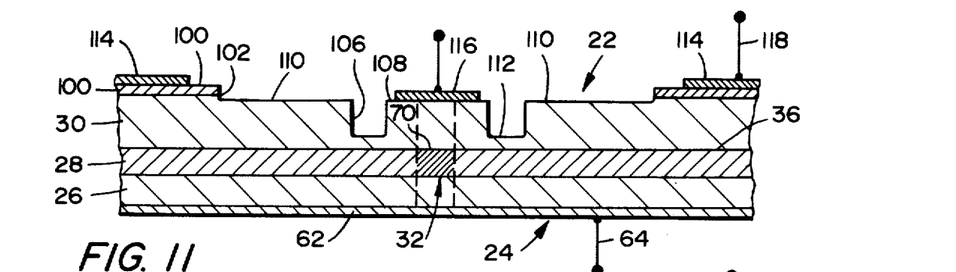
FIG. 11 is a cross-sectional view as in FIG. 7 showing another embodiment of a thyristor according to the invention.

Another embodiment of the invention is shown in FIG. 11. In this embodiment, a semiconductor body is used having at least four zones of alternate conductivity type as shown in FIGS. 2-4. As in the first embodiment, the body includes a centrally disposed initial breakover region 32 defining a localized breakover portion 70 of pn junction 36.

In the first masking and etching steps, equivalent to FIGS. 2 and 3 of the first embodiment, the N+ emitter zone is etched to provide an encircling first emitter 100. Within circular turn-on line 102 is an exposed portion of base zone 30 extending to top surface 22. The second etching step equivalent to FIG. 4 of the first embodiment provides a ring-shaped etch 106 extending into base zone 30 from the top surface. Etch 106 divides the base, partially separating first base portion 108, centrally disposed on the body, and second base portion 110, which extends radially outwardly from etch 106. The two base portions are joined by connecting portion 112 which provides a region of high resistivity in the base. As in the first embodiment, the first base portion is disposed adjacent breakover portion 70 of junction 36 and first emitter 100 is in contact with the second base portion 110.

The metalization forming emitter electrode 114 and gate 116 is applied in the conventional manner. In the embodiment of FIG. 11, the gate electrode is disposed on top surface 22 in contact with first base portion 108. As before, an anode contact 62 is provided on bottom surface 24. Anode and cathode terminals 64 and 118, respectively, permit external circuit connections.

In operation, the embodiment of FIG. 11 can be turned on when anode terminal 64 is forward biased relative to cathode terminal 118. Gate triggering is accomplished by supplying a positive gate current to gate electrode 116. The gate current causes turn-on along the emitter-base junction beginning at turn-on line 102. Turn-on via voltage breakover occurs when the terminal voltage between terminals 64 and 118 exceeds the forward breakover voltage. Forward breakover initiates at breakover portion 70 of junction 36. As in the previous embodiments, the initial current path between the anode and cathode terminals at breakover passes through the current limiting resistance 112 incorporated into base zone 30.

The resistive impedance provided by connecting portion 112 serves to reduce the initial breakover current thereby preventing excessive power dissipation at the localized breakover region. As is apparent to those skilled in the art, external circuit realizations could be provided for impedance 112 in the form of external resistive, inductive, or other impedance elements. Etch 106 would simply be deepened to divide the base into fully separate portions 108 and 110, and an additional metalized electrode would be provided outside the etch. As in the embodiments of FIGS. 8 and 9, an external circuit element would then be installed between the two base portions.

The embodiment of FIG. 11 provides an additional impedance not only during voltage breakover but also in the gate circuit. As such, this embodiment is only desirable where a relatively large triggering gate voltage is available.

Figure 12:
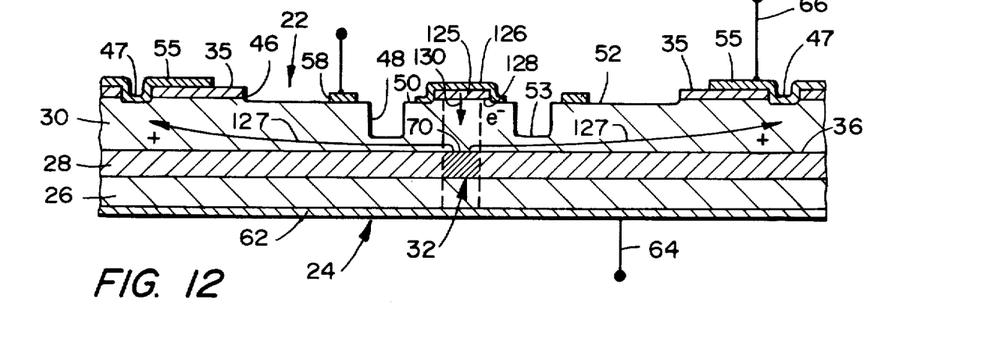
FIG. 12 is a cross-sectional view as in FIG. 7 showing another embodiment of a thyristor according to the invention.

Another embodiment of a thyristor according to the invention is shown in FIG. 12. This embodiment incorporates essentially the same thyristor structure and method of fabrication as the first embodiment shown in FIGS. 1-7. The only difference is the inclusion of an additional N+ region extending to top surface 22 in contact with the centrally disposed first base portion 50. This N+ region forms a second emitter 125 extending to top surface 22, and is easily provided during the fabrication process outlined for the first embodiment. To form the embodiment of FIG. 12, the masking layer 38 shown in FIG. 2 is modified to include an additional circular mask portion centrally disposed over the voltage breakover region 32. When the emitter zone is etched in the subsequent etching step, second emitter 125 is formed, separated from first emitter 35. After deep etch 48 is formed, second emitter 125 is left in contact with first base portion 50. The metalization steps of the first embodiment are used in the formation of the embodiment of FIG. 12. The centrally-disposed first base electrode 126 is equivalent to electrode 59 of the first embodiment, but contacts both first base portion 50 and second emitter 125. Electrode 126 serves a current-distributing function similar to electrode 59 of the first embodiment.

The resultant thyristor of this embodiment provides for a four-layer thyristor structure in the voltage breakover region. The significance of second emitter 125 during initial voltage breakover is illustrated in FIG. 12. As in the first embodiment, the thyristor can be switched into forward conduction from a blocking mode by raising the terminal voltage between terminals 64 and 66 above the forward breakover voltage. When the terminal voltage exceeds the forward breakover voltage, current begins to flow across the localized breakover portion 70 of blocking pn junction 36. The path of positive hole current is shown generally by arrows 127. The pn junction 128 extending between second emitter 125 and first base portion 50 becomes forward biased when the initial voltage breakover current increases sufficiently. This induces electrons to cross junction 128, as shown by arrow 130. The result is localized thyristor action producing a momentary low-resistance current path through the breakover region. The voltage drop across breakover junction 70 is significantly reduced by the injection of carriers from second emitter 125, lessening the possibility of localized burnout.

The improved conductivity produced during breakover by the presence of second emitter 125 is only momentary. Immediately after breakover initiates, the breakover current is limited by the above-described current limiting means, which in the embodiment of FIG. 12 is the higher resistance of connecting portion 53 in the base zone. As in the first embodiment, the main current-carrying portion of the device is eventually turned on by the positive hole current through base zone 30. The momentary reduction in the voltage drop produced by second emitter 125 is intended to further reduce the likelihood of localized junction burnout, which is already significantly reduced by the presence of the current limiting means of the present invention.

Figure 13:
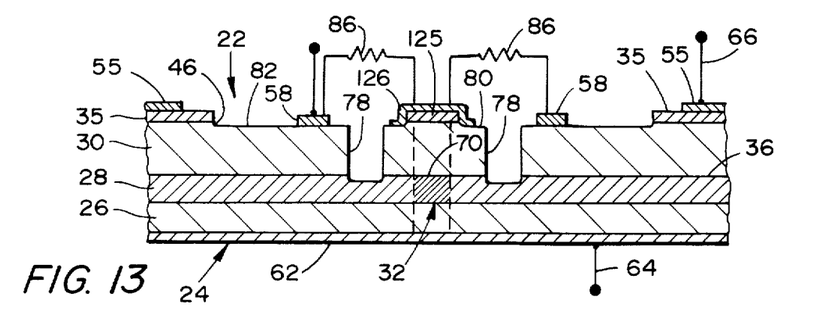
FIG. 13 is a cross-sectional view as in FIG. 7 showing another embodiment of a thyristor according to the invention.

Another embodiment of the invention is shown in FIG. 13. This embodiment is essentially the same as the embodiment shown in FIG. 8, but also includes the second emitter 125 and first base electrode 126 of the embodiment of FIG. 12. It will be readily appreciated that the fabrication of the embodiment of FIG. 13 is essentially the same as the fabrication of the embodiment of FIG. 8, except that an additional N+ emitter is left in contact with first base portion 80.

The operation of the embodiment of FIG. 13 is essentially the same as the embodiment of FIG. 8. The only difference in operation occurs during initial voltage breakover when the momentary thyristor action described with respect to the embodiment of FIG. 12 is produced. The result is a momentary reduction in the voltage drop along breakover portion 70 which serves to further reduce the likelihood of localized junction burnout.

Although the embodiment of FIG. 13 is shown having external impedance elements 86 which are resistors as in FIG. 8, inductive impedance elements such as shown in FIG. 9 could also be provided.

Figure 14:
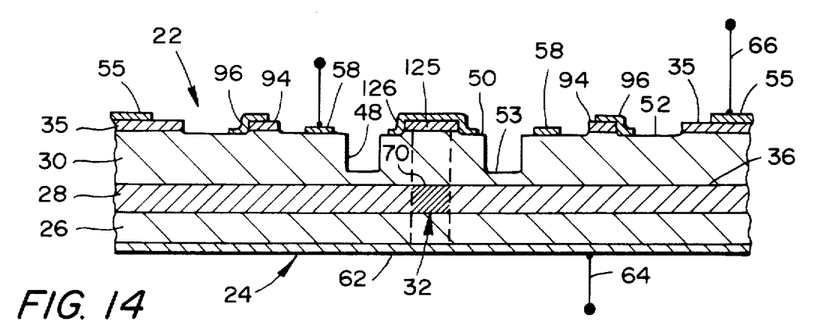
FIG. 14 is a cross-sectional view as in FIG. 7 showing another embodiment of a thyristor according to the invention.

Another embodiment of the invention is shown in FIG. 14. This embodiment is essentially the same as the embodiment shown in FIG. 10, but also includes the second emitter 125 and first base electrode 126 of the embodiment of FIG. 12. The fabrication of the embodiment of FIG. 14 is essentially the same as the fabrication of the embodiment of FIG. 10, except that an additional N+ emitter is left in contact with first base portion 50.

The operation of the embodiment of FIG. 14 is essentially the same as the embodiment of FIG. 10. The only difference in operation occurs during initial voltage breakover when the momentary thyristor action described with respect to the embodiment of FIG. 12 is produced. The result is a momentary reduction in the voltage drop along breakover portion 70 which serves to further reduce the likelihood of localized junction burnout.

Figure 15:
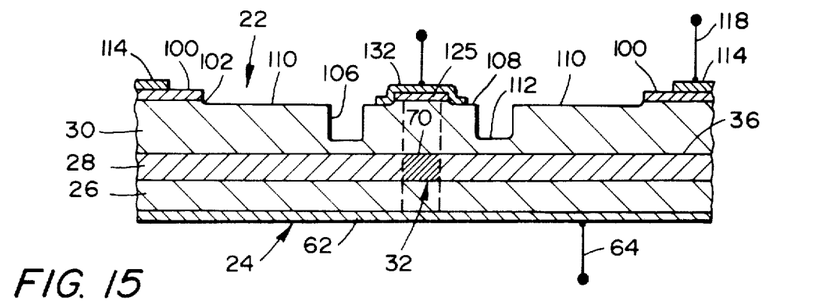
FIG. 15 is a cross-sectional view as in FIG. 7 showing another embodiment of a thyristor according to the invention.

Another embodiment of the invention is shown in FIG. 15. This embodiment is essentially the same as the embodiment shown in FIG. 11, but also includes the second emitter 125 of the embodiment of FIG. 12. An electrode 132 serves as a gate electrode disposed on top surface 22 in contact with first base portion 108 and second emitter 125. Gate electrode 130 operates in exactly the same manner as gate electrode 116 in the embodiment of FIG. 11. The fabrication of the embodiment of FIG. 15 is essentially the same as the fabrication of the embodiment of FIG. 11, except that an additional N+ emitter is left in contact with first base portion 108.

The operation of the embodiment of FIG. 15 is essentially the same as the embodiment of FIG. 11. The only difference in operation occurs during initial voltage breakover when the momentary thyristor action described with respect to the embodiment of FIG. 12 is produced. The result is a momentary reduction in the voltage drop along breakover portion 70 which serves to further reduce the likelihood of localized junction burnout.

The present invention provides a thyristor device which effectively controls the net power dissipation in the voltage breakover region. Several simple steps performed on the semiconductor body of the thyristor device effectively limit the forward voltage breakover current through the thyristor. Dividing the base zone of the semiconductor body serves to separate the portion of the base adjacent the breakover region from the remainder of the base which is in the main current-carrying part of the device. Current limiting means are then provided between the separated base portions. Since the initial forward voltage breakover current is constrained to enter the base zone through the breakover region, and then must pass into the main portion of the device, the breakover current will pass through the current limiting means. In each of the above embodiments, whether employing an etch extending partially or entirely through the base zone, the current limiting impedance will be in series with the anode and cathode during initial breakover. Because after turn-on the current is no longer constrained to pass through the voltage breakover region, the current limiting means is bypassed during all operations other than initial voltage breakover. Effective reduction in voltage breakover current is therefore provided without undesirable impairment of other thyristor performance parameters. Embodiments are provided which control either the level of initial breakover current or the current gradient. Effective protection is thus provided against thyristor failure during thyristor turn-on by voltage breakover.

Alternative embodiments are possible within the scope of the invention. Different external impedance elements could be installed, for example. Combined resistive and inductive impedances could be used. Both the internal connecting base portion and an external impedance could be employed in a single thyristor. The external impedances need not necessarily be wire-mounted but could be in the form of a ring which bridges the deep etch. Alternate means could also be provided for dividing the base portion to isolate the portion adjacent the voltage breakover region. One such alternative technique, shown in U.S. Pat. No. 4,047,219, involves the formation of a deep region of opposite conductivity type in the base zone which effectively limits lateral current flow. The invention could also be used in non-radial-emitter configurations. It is only necessary that the base be divided to separate the initial voltage breakover region from the remainder of the thyristor to permit installation of an intervening impedance. The base zone could initially be formed into separated portions, thus eliminating the need for the deep etch. Additional amplifying stages could be provided in any of the described embodiments.

A thyristor is provided which includes means for controlling the current through the device when the forward breakover voltage is exceeded. The invention additionally provides a method of forming a thyristor device which includes a current-controlling impedance for controlling power dissipation during voltage breakover.

What is claimed is:

1. A thyristor device for controlling current flow between a pair of terminals and which switches into forward conduction by means of a gate electrode and gate current or from a blocking mode when the terminal voltage between said terminals exceeds a breakover voltage, said thyristor device comprising: a semiconductor body having at least four zones of alternate conductivity type extending between said terminals, including an emitter zone having a first emitter in contact with one said terminal, a base zone adjacent said emitter zone, a blocking pn junction defining the boundary between said base zone and a third said zone adjacent said base zone, means in said body for localizing a breakover portion of said blocking pn junction where forward breakover initiates when said terminal voltage exceeds said breakover voltage, said base zone including a first base portion disposed adjacent said breakover portion of said blocking pn junction and a second base portion in contact with, said first emitter, said gate electrode being disposed on said second base portion and forming a gate turn-on channel region for said gate current in said second base portion between said gate electrode and said emitter zone, and current limiting means for limiting current flow in said base zone between said first and second base positions, said current limiting means electrically interconnecting and providing an impedance between said first and second base portions.

2. A thyristor device as in claim 1 in which said current limiting means includes a connecting portion of said base zone extending between said first and second base portions, said connecting portion having a higher resistivity than the remainder of said base zone.

3. A thyristor device as in claim 2 including an etch extending into said base zone to divide said base zone and partially separate said first and second base portions, said connecting portion being the portion of said base zone unremoved by said etch and extending between said first and second base portions.

4. A thyristor device as in claim 1 in which said first and second base portions are separated from one another and said current limiting means includes a resistor connected between said first and second base portions.

5. A thyristor device as in claim 1 in which said emitter zone includes a first emitter contacting one said terminal and said second base portion, and a second emitter separated from said first emitter and contacting said first base portion.

6. A thyristor device for controlling current flow between a pair of terminals and which switches into forward conduction by means of a gate electrode and gate current or from a blocking mode when the terminal voltage between said terminals exceeds a breakover voltage, said thyristor device comprising: a semiconductor body having a top surface and having at least four zones of alternate conductivity type extending between said terminals, including an emitter zone extending to said top surface having a first emitter contacting one said terminal, a base zone adjacent said emitter zone and also extending to said top surface, a blocking pn junction defining the boundary between said base zone and a third said zone adjacent said base zone, means in said body for localizing a breakover portion of said blocking pn junction where forward breakover initiates when said terminal voltage exceeds said breakover voltage, an etch formed on said top surface extending into said base zone to at least partially divide said base zone into a first base portion adjacent said breakover portion of said pn junction and a second base portion in contact with said first emitter, said gate electrode being disposed on said second base portion and forming a gate turn-on channel region for said gate current in said second base portion between said gate electrode and said emitter zone, and current limiting means for limiting current flow in said base zone between said first and second base portions, said current limiting means electrically interconnecting and providing an impedance between said first and second base portions.

7. A thyristor device as in claim 6 in which said etch extends partially into said base zone to divide said base zone and partially separate said first and second base portions said current limiting means including the unremoved portion of said base zone beneath said etch extending between said first and second base portions.

8. A thyristor device as in claim 6 in which said etch extends through said base zone to said third zone to divide said base zone and fully separate said first and second base portions, said current limiting means including a resistor connected between said first and second base portions.

9. A thyristor device as in claim 6 said gate electrode being disposed on said top surface in contact with said second base portion.

10. A thyristor device as in claim 9 including a first base electrode on said top surface in contact with said first base portion.

11. A thyristor device as in claim 10 in which said etch extends through said base zone to said third zone to divide said base zone and fully separate said first and second base portions, said current limiting means being connected between said gate electrode and said first base electrode.

12. A thyristor device as in claim 6 in which said emitter zone includes said first emitter in contact with one said terminal and a separate amplifying stage emitter, both said emitters extending to said top surface and both contacting said second base portion, a gate electrode for switching said thyristor device into forward conduction by means of gate current, said gate electrode being disposed on said top surface in contact with said second base portion, and an amplifying stage electrode on said top surface in contact with said amplifying stage emitter and said second base portion.

13. A thyristor device as in claim 6 in which said breakover portion of said blocking pn junction and said first base portion are centrally disposed in said semiconductor body, said etch forming a closed ring on said top surface encircling said first base portion, said second base portion extending outwardly from said etch.

14. A thyristor device as claim 13 including a gate electrode for switching said thyristor device into forward conduction by means of gate current, said gate electrode forming a ring on said top surface in contact with said second base portion and encircling said first base portion.

15. A thyristor device as in claim 14 in which said emitter zone encircles said gate electrode, being an equal minimum distance from said gate electrode at all points.

16. A thyristor device as in claim 6 in which said emitter zone includes a first emitter contacting one said terminal and said second base portion, and a second emitter separated from said first emitter and contacting said first base portion.

17. A thyristor device as in claim 16 in which said etch extends partially into said base zone to divide said base zone and partially separate said first and second base portions, said current limiting means including the unremoved portion of said base zone beneath said etch extending between said first and second base portions, and including a first base electrode on said top surface in contact with said first base portion and said second emitter.

18. A thyristor device as in claim 17 including a gate electrode for switching said thyristor device into forward conduction by means of gate current, said gate electrode being disposed on said top surface in contact with said second base portion.

19. A thyristor device as in claim 16 in which said etch extends through said base zone to said third zone to divide said base zone and fully separate said first and second base portions, said current limiting means including an external impedance element connected between said first and second base portions.

20. A thyristor device as in claim 19 including a gate electrode for switching said thyristor device into forward conduction by means of gate current, said gate electrode being disposed on said top surface in contact with said second base portion, and including a first base electrode on said top surface in contact with said first base portion and said second emitter, said external impedance element being connected between said gate electrode and said first base electrode.

21. A thyristor device as in claim 16 in which said emitter zone further includes a separate amplifying stage emitter extending to said top surface in contact with said second base portion, a gate electrode for switching said thyristor device into forward conduction by means of gate current, said gate electrode being disposed on said top surface in contact with said second base portion, an amplifying stage electrode on said top surface in contact with said amplifying stage emitter and said second base portion, and a first base electrode on said top surface in contact with said first base portion and said second emitter.

22. A thyristor device as in claim 16 including a gate electrode for switching said thyristor device into forward conduction by means of gate current, said gate electrode being disposed on said top surface in contact with said first base portion and said second emitter.

23. A thyristor device for controlling current flow between a pair of terminals and which switches into forward conduction from a blocking mode when the terminal voltage between said terminals exceeds a breakover voltage, said thyristor device comprising: a semiconductor body having at least four zones of alternate conductivity type extending between said terminals, including an emitter zone having a first emitter in contact with one said terminal, a base zone adjacent said emitter zone, a blocking pn junction defining the boundary between said base zone and a third said zone adjacent said base zone, means in said body for localizing a breakover portion of said blocking pn junction where forward breakover initiates when said terminal voltage exceeds said breakover voltage, said base zone including first and second base portion fully separated from one another with said first base portion disposed adjacent said breakover portion of said blocking pn junction and said second base portion contacting said first emitter, and current limiting means including an inductive element connected between said first and second base portions to provide an impedance between said first and second base portions.

24. A thyristor device for controlling current flow between a pair of terminals and which switches into forward conduction from a blocking mode when the terminal voltage between said terminals exceeds a breakover voltage, said thyristor device comprising: a semiconductor body having a top surface and having at least four zones of alternate conductivity type extending between said terminals, including an emitter zone extending to said top surface having a first emitter contacting one said terminal, a base zone adjacent said emitter zone and also extending to said top surface, a blocking pn junction defining the boundary between said base zone and a third said zone adjacent said base zone, means in said body for localizing a breakover portion of said blocking pn junction where forward breakover initiates when said terminal voltage exceeds said breakover voltage, an etch formed on said top surface extending into said base zone to divide said base zone into fully separate first and second base portions with said first base portion adjacent said breakover portion of said pn junction and said second base portion in contact with said emitter zone, and current limiting means including an inductive element connected between said first and second base portions.

25. A thyristor device as in claims 1 or 6 where said impedance has a resistance value at least an order of magnitude greater than the resistance of said channel region.

* * * * *